United States Patent
Choi et al.

(10) Patent No.: US 11,947,227 B2
(45) Date of Patent: Apr. 2, 2024

(54) DISPLAY DEVICE

(71) Applicant: Samsung Display Co., LTD., Yongin-si (KR)

(72) Inventors: Ha Young Choi, Cheonan-si (KR); Joong Mok Lee, Gunsan-si (KR); Chung Seok Lee, Hwaseong-si (KR); Eun Jeong Jeon, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 44 days.

(21) Appl. No.: 17/775,486

(22) PCT Filed: May 15, 2020

(86) PCT No.: PCT/KR2020/006418
§ 371 (c)(1),
(2) Date: May 9, 2022

(87) PCT Pub. No.: WO2021/096010
PCT Pub. Date: May 20, 2021

(65) Prior Publication Data
US 2022/0397787 A1    Dec. 15, 2022

(30) Foreign Application Priority Data

Nov. 11, 2019    (KR) .................. 10-2019-0143712

(51) Int. Cl.
*G02F 1/1345* (2006.01)
*H05K 1/18* (2006.01)
*H05K 3/32* (2006.01)

(52) U.S. Cl.
CPC ...... *G02F 1/13458* (2013.01); *G02F 1/13452* (2013.01); *H05K 1/189* (2013.01); *H05K 3/323* (2013.01); *H05K 2201/10128* (2013.01)

(58) Field of Classification Search
CPC ..................................................... G02F 1/1345
See application file for complete search history.

(56) References Cited

U.S. PATENT DOCUMENTS 6,596,947 B1 * 7/2003 Kurita .................... H05K 1/036
228/208
9,761,560 B2    9/2017 Lee et al.
(Continued)

FOREIGN PATENT DOCUMENTS

KR    10-0327441    8/2002
KR    2003-0050830    6/2003
(Continued)

OTHER PUBLICATIONS

International Search Report, with English translation, corresponding to International Application No. PCT/KR2020/006418 dated Aug. 13, 2020.
(Continued)

*Primary Examiner* — Sang V Nguyen
(74) *Attorney, Agent, or Firm* — KILE PARK REED & HOUTTEMAN PLLC

(57) ABSTRACT

A display device includes a display panel including a first signal pad portion including first signal pads, a second signal pad portion including second signal pads, and a first dummy pad portion disposed between the first signal pad portion and the second signal pad portion and including at least one first dummy pad, and a flexible circuit board including a first terminal portion including first terminals, a second terminal portion including second terminals, and a first cut portion disposed between the first terminal portion and the second terminal portion. The flexible circuit board is compressed to the display panel. The first terminals are electrically connected to the first signal pads. The second terminals are (Continued)

electrically connected to the second signal pads. The first cut portion overlaps the first dummy pad portion.

22 Claims, 9 Drawing Sheets

(56) References Cited

U.S. PATENT DOCUMENTS

| | | | | |
|---|---|---|---|---|
| 2004/0183959 A1* | 9/2004 | Ishida | ................. | G02F 1/13452 |
| | | | | 349/58 |
| 2014/0307397 A1* | 10/2014 | Osako | ................... | H05B 33/02 |
| | | | | 361/749 |
| 2016/0181349 A1* | 6/2016 | Cho | ...................... | H10K 59/88 |
| | | | | 257/40 |
| 2016/0270234 A1* | 9/2016 | Ahn | ...................... | H05K 1/028 |
| 2019/0281692 A1* | 9/2019 | Jeon | ..................... | H10K 59/131 |

FOREIGN PATENT DOCUMENTS

| | | |
|---|---|---|
| KR | 10-2006-0122459 | 11/2006 |
| KR | 10-2012-0049733 | 5/2012 |
| KR | 10-2015-0018067 | 2/2015 |
| KR | 10-2016-0110861 | 9/2016 |
| KR | 10-2019-0107210 | 9/2019 |

OTHER PUBLICATIONS

Written Opinion corresponding to International Application No. PCT/KR2020/006418, dated Aug. 13, 2020.
English Translation of Written Opinion corresponding to International Application No. PCT/KR2020/006418, dated Aug. 13, 2020.

\* cited by examiner

DISPLAY DEVICE

CROSS REFERENCE TO RELATED APPLICATION(S)

This application is a national entry of International Application No. PCT/KR2020/006418, filed on May 15, 2020, which claims under 35 U.S.C. §§ 119(a) and 365(b) priority to and benefits of Korean Patent Application No. 10-2019-0143712, filed on Nov. 11, 2019, in the Korean Intellectual Property Office (KIPO), the entire contents of which are incorporated herein by reference.

BACKGROUND

1. Technical Field

Embodiments relate to an electronic apparatus. More particularly, embodiments relate to a display device including a flexible circuit board.

2. Description of the Related Art

Recently, a flat panel display device such as a liquid crystal display device, an organic light emitting display device, or the like has been widely used. The flat panel display device may include a display panel that displays an image and a flexible circuit board that provides signals to the display panel. As a method of connecting the flexible circuit board to the display panel, a method of interposing an anisotropic conductive film between the display panel and the flexible circuit board and compressing the flexible circuit board to the display panel by applying heat and pressure may be used.

SUMMARY

Provided in the disclosure are embodiments of a display device including a flexible circuit board having reduced stretch dispersion.

In an embodiment, a display device may include a display panel including a first signal pad portion including a plurality of first signal pads, a second signal pad portion including a plurality of second signal pads, and a first dummy pad portion disposed between the first signal pad portion and the second signal pad portion and including at least one first dummy pad; and a flexible circuit board including a first terminal portion including a plurality of first terminals, a second terminal portion including a plurality of second terminals, and a first cut portion disposed between the first terminal portion and the second terminal portion. The flexible circuit board may be compressed to the display panel. The plurality of first terminals may be electrically connected to the plurality of first signal pads. The plurality of second terminals may be electrically connected to the plurality of second signal pads. The first cut portion may overlap the first dummy pad portion.

In an embodiment, a number of the plurality of first terminals may be equal to a number of the plurality of second terminals.

In an embodiment, a number of the plurality of first terminals may be different from a number of the plurality of second terminals.

In an embodiment, the display panel may further include a third signal pad portion including a plurality of third signal pads, and a second dummy pad portion disposed between the second signal pad portion and the third signal pad portion and including at least one second dummy pad, and the flexible circuit board may further include a third terminal portion including a plurality of third terminals electrically connected to the plurality of third signal pads, and a second cut portion disposed between the second terminal portion and the third terminal portion and overlapping the second dummy pad portion.

In an embodiment, a number of the plurality of first terminals, a number of the plurality of second terminals, and a number of the plurality of third terminals may be equal to each other.

In an embodiment, a number of the plurality of first terminals, a number of the plurality of second terminals, or a number of the plurality of third terminals may be different from each other.

In an embodiment, the plurality of first terminals may be arranged in a first direction, and a width of the first cut portion in the first direction may be equal to a width of the second cut portion in the first direction.

In an embodiment, the display panel may further include a third signal pad portion including a plurality of third signal pads, and a blank portion disposed between the second signal pad portion and the third signal pad portion, and the flexible circuit board may further include a third terminal portion including a plurality of third terminals electrically connected to the plurality of third signal pads, and a second cut portion disposed between the second terminal portion and the third terminal portion and overlapping the blank portion.

In an embodiment, the plurality of first terminals may be arranged in a first direction, and a width of the first cut portion in the first direction may be greater than a sum of a width of each of the plurality of first terminals in the first direction and a distance between adjacent ones of the plurality of first terminals.

In an embodiment, the width of the first cut portion in the first direction may be less than about 2000 μm.

In an embodiment, each of the plurality of first terminals may extend in a second direction orthogonal to the first direction, and a width of the first cut portion in the second direction may be equal to a width of each of the plurality of first terminals in the second direction.

In an embodiment, each of the plurality of first terminals may extend in a second direction orthogonal to the first direction, and a width of the first cut portion in the second direction may be less than a width of each of the plurality of first terminals in the second direction.

In an embodiment, each of the plurality of first terminals may extend in a second direction orthogonal to the first direction, and a width of the first cut portion in the second direction may be greater than a width of each of the plurality of first terminals in the second direction.

In an embodiment, a planar shape of the first cut portion may be a rectangle, a semicircle, a triangle, a trapezoid, or a pentagon.

In an embodiment, the flexible circuit board may further include a driving chip electrically connected to the plurality of first terminals and the plurality of second terminals.

In an embodiment, the display device may further include an anisotropic conductive layer disposed between the display panel and the flexible circuit board, the anisotropic conductive layer respectively electrically connecting the plurality of first terminals to the plurality of first signal pads and the plurality of second terminals to the plurality of second signal pads.

In an embodiment, the flexible circuit board may further include a base layer stretching in response to an external pressure, and the plurality of first terminals and the plurality of second terminals may be disposed on the base layer.

In other embodiments, a display device may include a display panel including a first signal pad portion including a plurality of first signal pads, a second signal pad portion including a plurality of second signal pads, and a blank portion disposed between the first signal pad portion and the second signal pad portion; and a flexible circuit board including a first terminal portion including a plurality of first terminals, a second terminal portion including a plurality of second terminals, and a cut portion disposed between the first terminal portion and the second terminal portion. The flexible circuit board may be compressed to the display panel. The plurality of first terminals may be electrically connected to the plurality of first signal pads. The plurality of second terminals may be electrically connected to the plurality of second signal pads. The cut portion may overlap the blank portion.

In an embodiment, a number of the plurality of first terminals may be equal to a number of the plurality of second terminals.

In an embodiment, a number of the plurality of first terminals may be different from a number of the plurality of second terminals.

In the display device according to the embodiments, the flexible circuit board may include the cut portion disposed between the first terminal portion and the second terminal portion, and may be compressed to the display panel such that the cut portion may overlap the dummy pad portion of the display panel, so that stretch dispersion of the flexible circuit board may be reduced in the process of compressing the flexible circuit board to the display panel by applying heat and pressure.

DETAILED DESCRIPTION OF THE EMBODIMENTS

Hereinafter, display devices in accordance with embodiments of the disclosure will be explained in detail with reference to the accompanying drawings.

Figure 1:
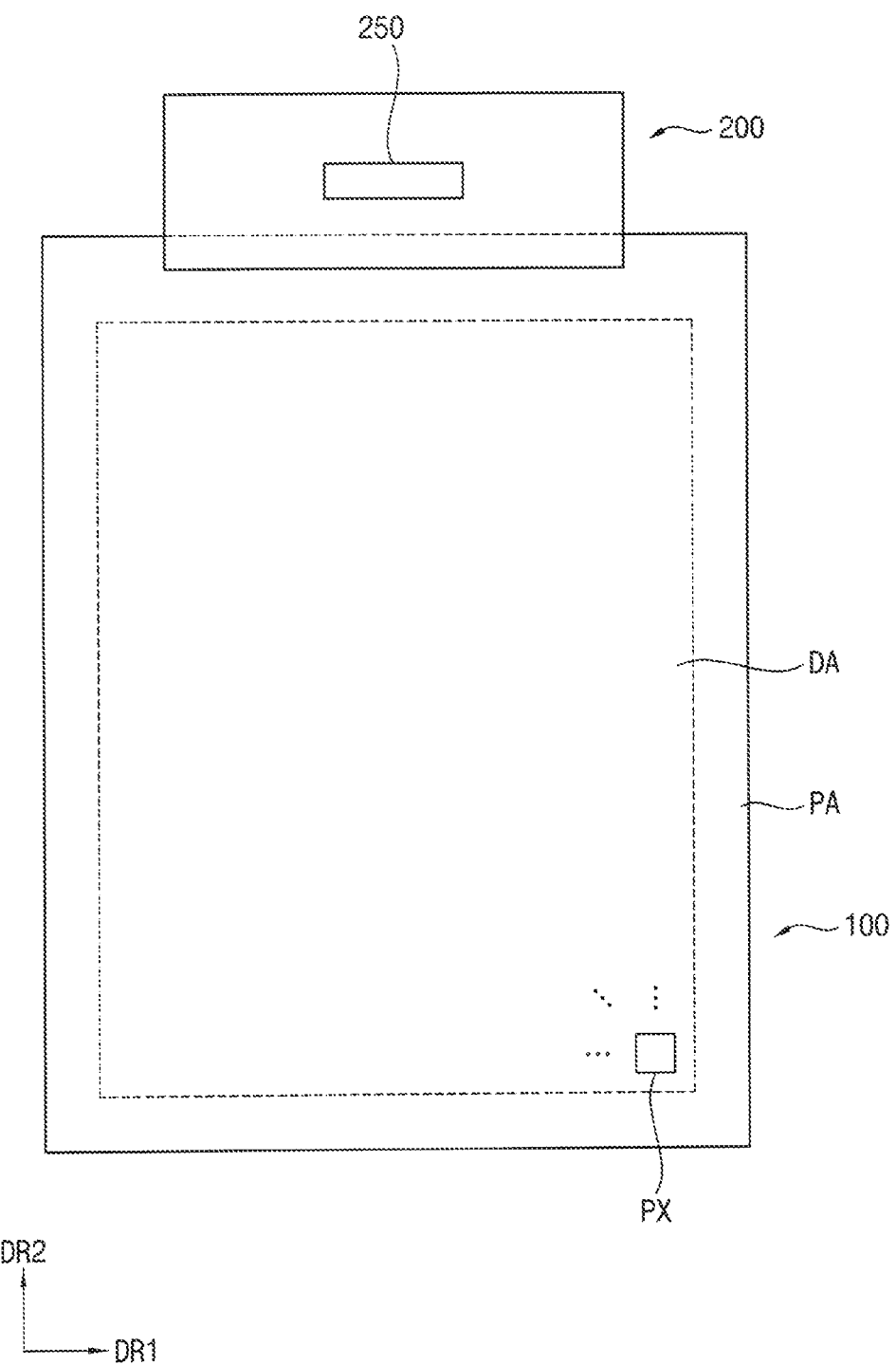
FIG. 1 is a plan view illustrating a display device according to an embodiment.
Figure 2:
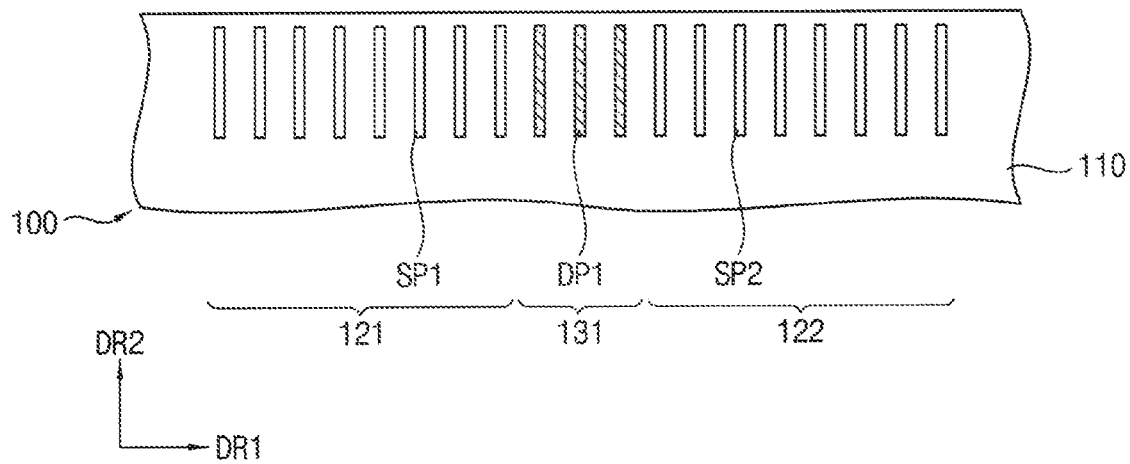
FIG. 2 is a plan view illustrating a portion of a display panel according to an embodiment.
Figure 3:
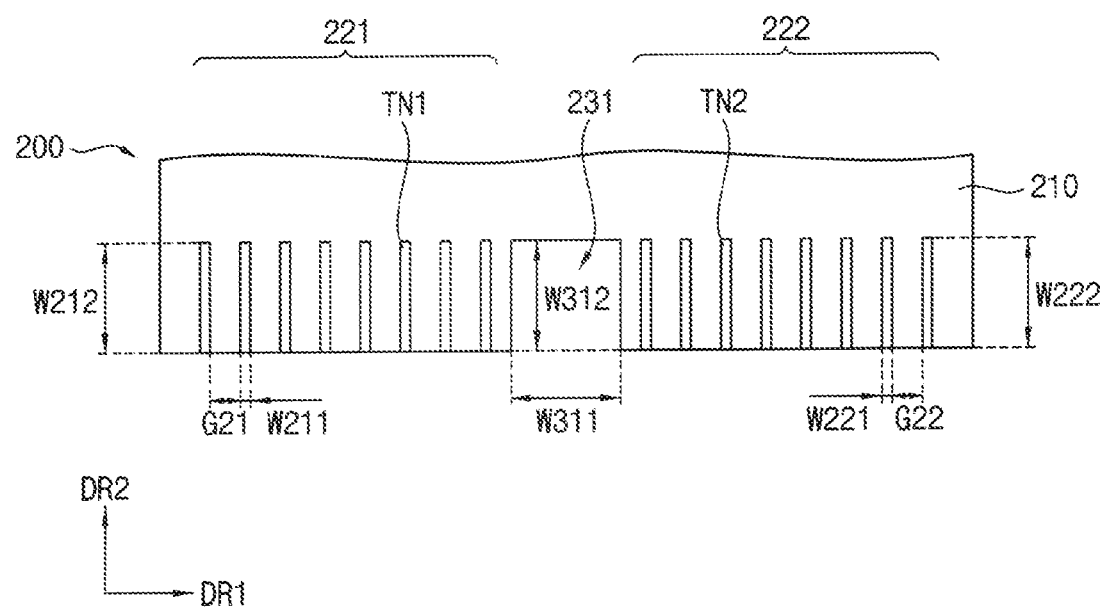
FIG. 3 is a plan view illustrating a portion of a flexible circuit board according to an embodiment.

FIG. 1 is a plan view illustrating a display device according to an embodiment. FIG. 2 is a plan view illustrating a portion of a display panel 100 according to an embodiment. FIG. 3 is a plan view illustrating a portion of a flexible circuit board 200 according to an embodiment.

Referring to FIGS. 1, 2, and 3, a display device according to an embodiment may include a display panel 100 and a flexible circuit board 200. The display panel 100 may display an image, and the flexible circuit board 200 may be electrically connected to the display panel 100 to provide signals, voltages, or the like to the display panel 100.

The display panel 100 may include a display area DA and a peripheral area PA. The display panel 100 may include multiple pixels PX disposed in the display area DA. In an embodiment, the pixels PX may be arranged in a substantially matrix form along a first direction DR1 and a second direction DR2 substantially orthogonal to the first direction DR1. The display area DA may display an image formed of light emitted from each of the pixels PX.

The peripheral area PA may be disposed outside of the display area DA. In an embodiment, the peripheral area PA may surround the display area DA. The display panel 100 may include a pad portion disposed in the peripheral area PA. In an embodiment, the pad portion may be disposed in the second direction DR2 from the display area DA.

In an embodiment, the pad portion may include a first signal pad portion 121, a second signal pad portion 122, and a first dummy pad portion 131. The first dummy pad portion 131 may be disposed between the first signal pad portion 121 and the second signal pad portion 122. For example, the first dummy pad portion 131 may be disposed adjacent to the first signal pad portion 121 in the first direction DR1, and the second signal pad portion 122 may be disposed adjacent to the first dummy pad portion 131 in the first direction DR1.

The first signal pad portion 121 may include multiple first signal pads SP1 disposed on a substrate 110. The first signal pads SP1 may be arranged along the first direction DR1, and each of the first signal pads SP1 may extend in the second direction DR2. In an embodiment, distances between adjacent first signal pads SP1 in the first direction DR1 may be uniform.

The second signal pad portion 122 may include multiple second signal pads SP2 disposed on the substrate 110. The second signal pads SP2 may be arranged along the first direction DR1, and each of the second signal pads SP2 may extend in the second direction DR2. In an embodiment, a gap between adjacent second signal pads SP2 in the first direction DR1 may be uniform. In an embodiment, the distance between the adjacent second signal pads SP2 may be substantially equal to the distance between the adjacent first signal pads SP1.

Signals, voltages, or the like may be provided from the flexible circuit board 200 to the first signal pads SP1 and the second signal pads SP2, and the first signal pads SP1 and the second signal pads SP2 may be electrically connected to the pixels PX to provide the signals, the voltages, or the like to the pixels PX. In an embodiment, the first signal pads SP1 and the second signal pads SP2 may provide data signals to the pixels PX. However, the disclosure is not limited thereto, and in an embodiment, the first signal pads SP1 and the second signal pads SP2 may provide scan signals, power voltages, or the like to the pixels PX.

In an embodiment, the number of the first signal pads SP1 may be equal to the number of the second signal pads SP2. In an embodiment, the number of the first signal pads SP1 may be different from the number of the second signal pads SP2.

The first dummy pad portion 131 may include at least one first dummy pad DP1 disposed on the substrate 110. Hereinafter, it will be described in case the first dummy pad portion 131 includes multiple first dummy pads DP1. The first dummy pads DP1 may be arranged along the first direction DR1, and each of the first dummy pads DP1 may extend in the second direction DR2. In an embodiment, distances between adjacent first dummy pads DP1 in the first direction DR1 may be uniform. In an embodiment, the distance between the adjacent first dummy pads DP1 may be equal to the distance between the adjacent first signal pads SP1 and/or the distance between the adjacent second signal pads SP2.

Signals, voltages, or the like may not be provided to the first dummy pads DP1 from the flexible circuit board 200, and the first dummy pads DP1 may not be electrically connected to the pixels PX. The first dummy pads DP1 may shield electrical interference between the first signal pads SP1 and the second signal pads SP2.

In an embodiment, the flexible circuit board 200 may include a first terminal portion 221, a second terminal portion 222, and a first cut portion 231. The first cut portion 231 may be disposed between the first terminal portion 221 and the second terminal portion 222. For example, the first cut portion 231 may be disposed adjacent to the first terminal portion 221 in the first direction DR1, and the second terminal portion 222 may be disposed adjacent to the first cut portion 231 in the first direction DR1.

In an embodiment, the flexible circuit board 200 may further include a driving chip 250. The driving chip 250 may convert signals provided from an external device. For example, the driving chip 250 may convert image signals provided from the external device into the data signals to be provided to the display panel 100.

The first terminal portion 221 may include multiple first terminals TN1 disposed on a base layer 210. The first terminals TN1 may be arranged along the first direction DR1, and each of the first terminals TN1 may extend in the second direction DR2. In an embodiment, distances G21 between adjacent first terminals TN1 in the first direction DR1 may be uniform. Further, a width W211 in the first direction DR1 and a width W212 in the second direction DR2 of each of the first terminals TN1 may be uniform.

The second terminal portion 222 may include multiple second terminals TN2 disposed on the base layer 210. The second terminals TN2 may be arranged along the first direction DR1, and each of the second terminals TN2 may extend in the second direction DR2. In an embodiment, distances G22 between adjacent second terminals TN2 in the first direction DR1 may be uniform. Further, a width W221 in the first direction DR1 and a width W222 in the second direction DR2 of each of the second terminals TN2 may be uniform.

In an embodiment, the distance G22 between the adjacent second terminals TN2 may be substantially equal to the distance G21 between the adjacent first terminals TN1. Further, the width W221 in the first direction DR1 and the width W222 in the second direction DR2 of each of the second terminals TN2 may be substantially equal to the width W211 in the first direction DR1 and the width W212 in the second direction DR2 of each of the first terminals TN1, respectively.

The first terminals TN1 and the second terminals TN2 may be electrically connected to the driving chip 250, and signals, voltage, or the like may be provided from the driving chip 250 to the first terminals TN1 and/or the second terminals TN2. In an embodiment, the first terminals TN1 and the second terminals TN2 may receive the data signals from the driving chip 250.

The first terminals TN1 and the second terminals TN2 may be respectively electrically connected to the first signal pads SP1 and the second signal pads SP2. In an embodiment, the first terminals TN1 and the second terminals TN2 may be respectively in a one-to-one correspondence with the first signal pads SP1 the second signal pads SP2. In such an embodiment, the number of the first terminals TN1 and the number of the second terminals TN2 may be equal to the number of the first signal pads SP1 and the number of the second signal pads SP2, respectively.

In an embodiment, the number of the first terminals TN1 may be equal to the number of the second terminals TN2. In an embodiment, the number of the first terminals TN1 may be different from the number of the second terminals TN2.

The first cut portion 231 may be an area where a portion of the flexible circuit board 200 is cut. In an embodiment, the first cut portion 231 may have a shape in which a portion of an edge of the flexible circuit board 200, which is adjacent to the first and second terminal portions 221 and 222 and positioned between the first terminal portion 221 and the second terminal portion 222, is recessed into the flexible circuit board 200.

In an embodiment, a width W311 of the first cut portion 231 in the first direction DR1 may be greater than the sum of the width W211 of each of the first terminals TN1 in the first direction DR1 and distance G21 between the adjacent first terminals TN1. In other words, the width W311 of the first cut portion 231 in the first direction DR1 may be greater than a pitch of the first terminals TN1, which is the sum of the width W211 of the first terminal TN1 in the first direction DR1 and the distance G21 between the adjacent first terminals TN1. In an embodiment, the pitch of the first terminals TN1 may be about 25 μm or less. As described above, the width W221 of each of the second terminals TN2 in the first direction DR1 may be substantially equal to the width W211 of each of the first terminals TN1 in the first direction DR1, and the distance G22 between the adjacent second terminals TN2 may be substantially equal to the distance G21 between the adjacent first terminals TN1, so that the width W311 of the first cut portion 231 in the first direction DR1 may be greater than the sum of the width W221 of each of the second terminals TN2 in the first direction DR1 and the distance G22 between the adjacent second terminals TN2.

In an embodiment, the width W311 of the first cut portion 231 in the first direction DR1 may be less than about 2000 μm. When the width W311 of the first cut portion 231 in the first direction DR1 is greater than about 2000 μm, the base layer 210 may bend, and thus, the shape of the flexible circuit board 200 may deform.

In an embodiment, the width W312 of the first cut portion 231 in the second direction DR2 may be substantially equal to the width W212 of each of the first terminals TN1 in the second direction DR2. As described above, the width W222 of each of the second terminals TN2 in the second direction DR2 may be substantially equal to the width W212 of each of the first terminals TN1 in the second direction DR2, so that the width W312 of the first cut portion 231 in the second direction DR2 may be substantially equal to the width W222 of each of the second terminals TN2 in the second direction DR2.

Figure 4A:
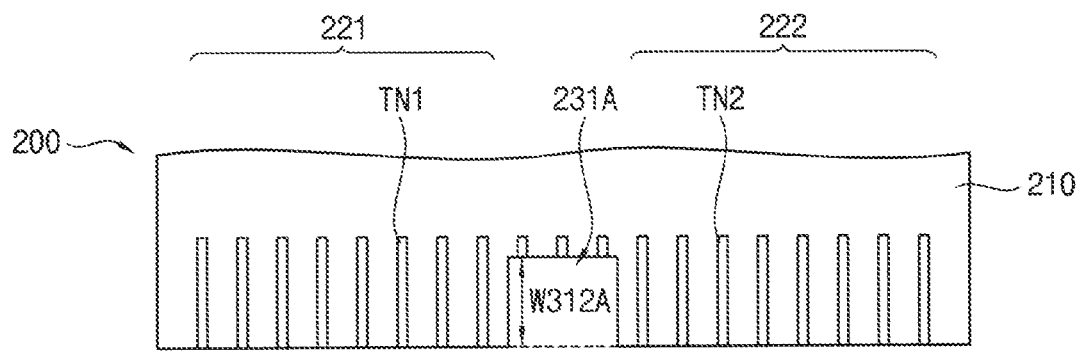
FIGS. 4A and 4B are plan views illustrating a portion of a flexible circuit board according to embodiments.
Figure 4B:
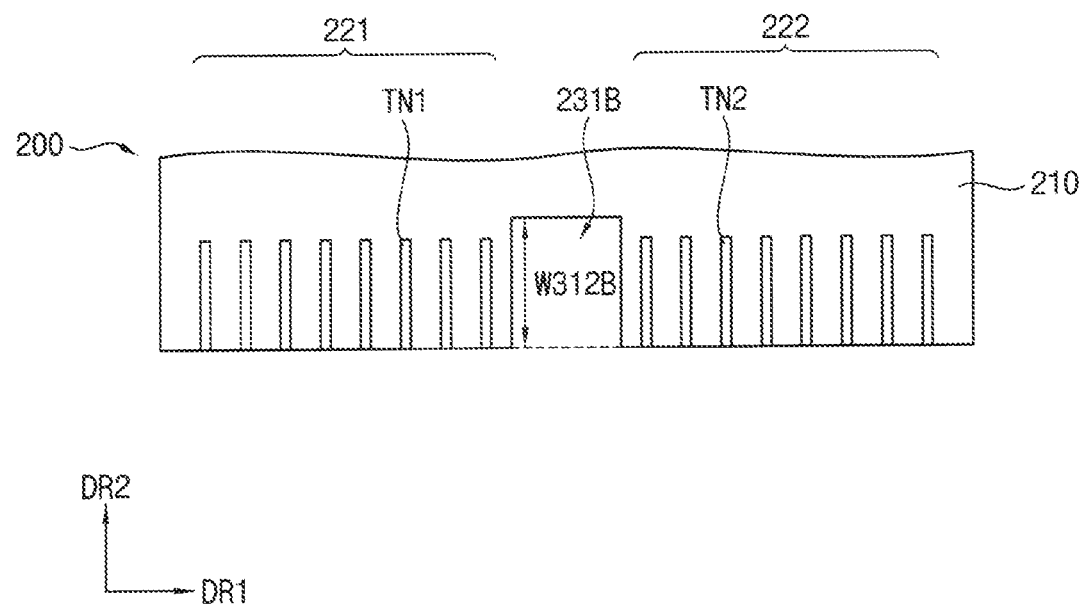
Figure 4C:
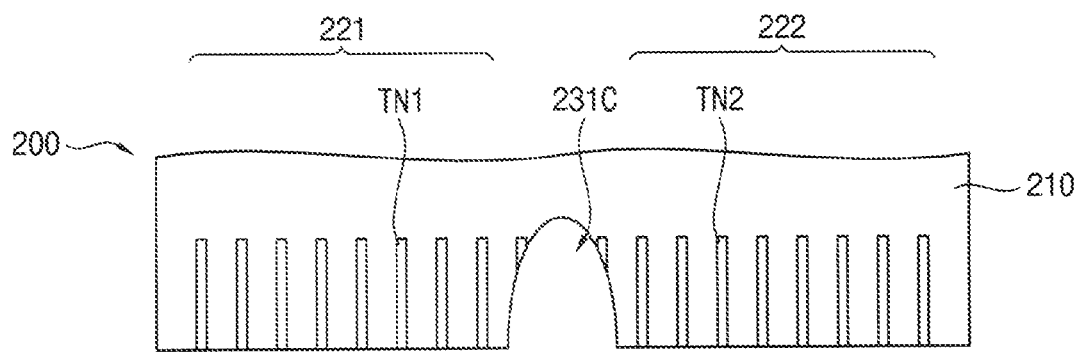
FIGS. 4C, 4D, 4E, and 4F are plan views illustrating a portion of a flexible circuit board according to embodiments.
Figure 4D:
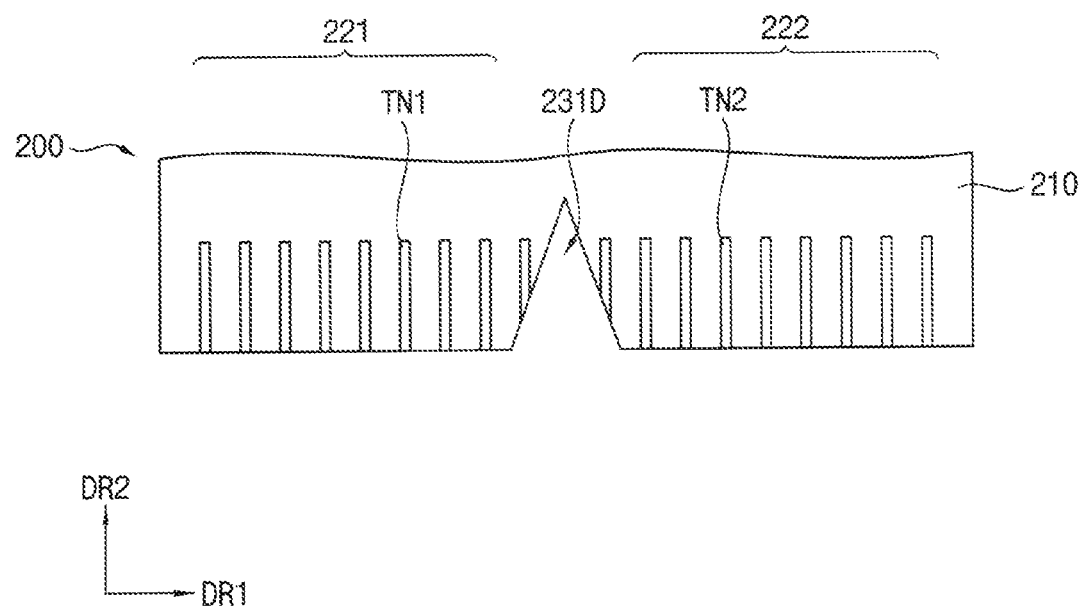
Figure 4E:
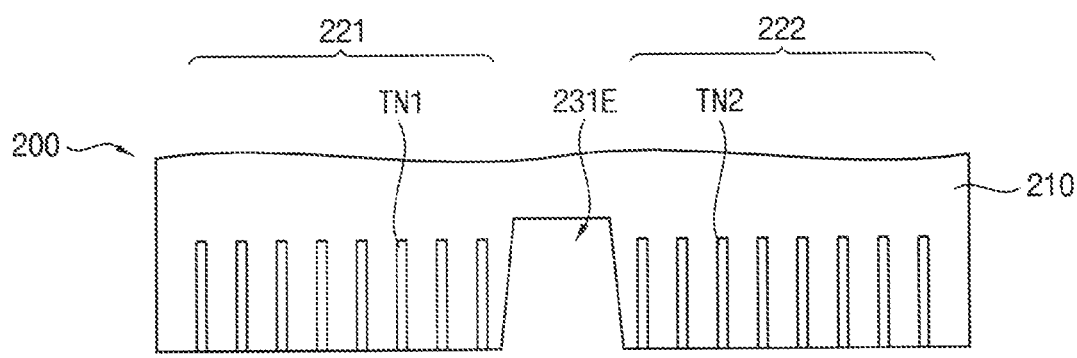
Figure 4E:
Figure 4F:
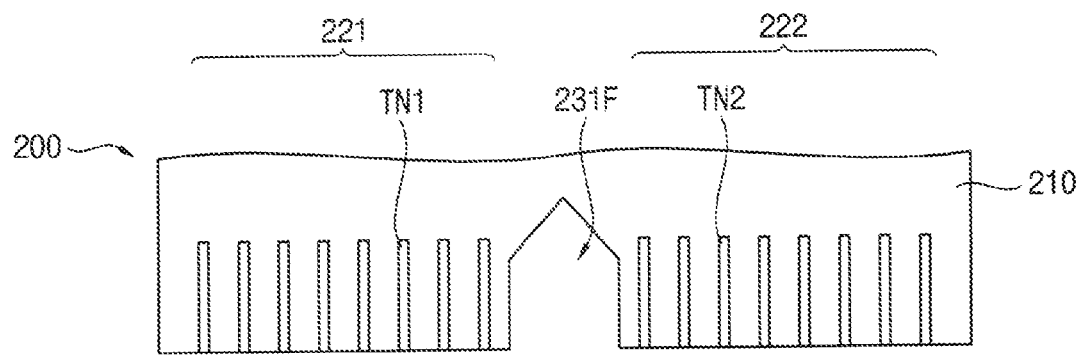
Figure 4F:

FIGS. 4A and 4B are plan views illustrating a portion of a flexible circuit board 200 according to embodiments.

Referring to FIG. 4A, in an embodiment, a width W312A of the first cut portion 231A in the second direction DR2 may be less than the width of each of the first terminals TN1 in the second direction DR2. For example, the width W312A of the first cut portion 231A in the second direction DR2 may be greater than or substantially equal to a value obtained by subtracting 50 μm from the width of the first terminal TN1 in the second direction DR2, and may be less than the width of each of the first terminals TN1 in the second direction DR2. As described above, the width of each of the second terminals TN2 in the second direction DR2 may be substantially equal to the width of each of the first terminals TN1 in the second direction DR2, so that the width W312A of the first cut portion 231A in the second direction DR2 may be less than the width of each of the second terminals TN2 in the second direction DR2.

Referring to FIG. 4B, in an embodiment, a width W312B of the first cut portion 231B in the second direction DR2 may be greater than the width of each of the first terminals TN1 in the second direction DR2. For example, the width W312B of the first cut portion 231B in the second direction DR2 may be greater than the width of each of the first terminals TN1 in the second direction DR2 and may be less than or substantially equal to a value obtained by adding 50 μm to the width of the first terminal TN1 in the second direction DR2. As described above, the width of each of the second terminals TN2 in the second direction DR2 may be substantially equal to the width of each of the first terminals TN1 in the second direction DR2, so that the width W312B of the first cut portion 231B in the second direction DR2 may be greater than the width of each of the second terminals TN2 in the second direction DR2.

Referring to FIG. 3 again, in an embodiment, the first cut portion 231 may have a planar shape of a rectangle. In such an embodiment, the width W311 of the first cut portion 231 in the first direction DR1 may be substantially equal to or different from the width W312 of the first cut portion 231 in the second direction DR2.

FIGS. 4C, 4D, 4E, and 4F are plan views illustrating a portion of a flexible circuit board 200 according to embodiments.

Referring to FIGS. 4C, 4D, 4E, and 4F, in embodiments, the first cut portion 231C, 231D, 231E, and 231F may have a planar shape of a semicircle, a triangle, a trapezoid, or a pentagon. However, the disclosure is not limited thereto, and the first cut portion 231 may have a polygonal shape different from those illustrated in FIGS. 3, 4C, 4D, 4E, and 4F.

Figure 5:
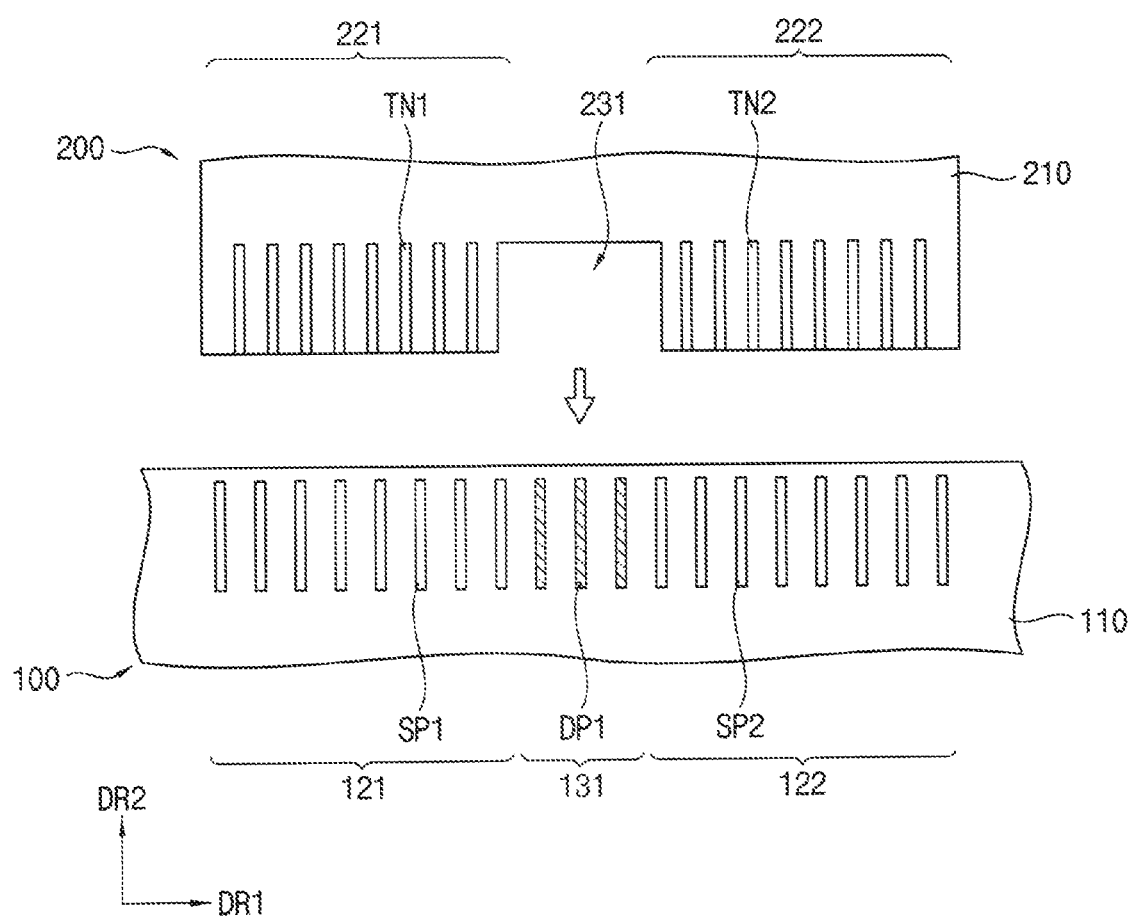
FIG. 5 is a plan view illustrating a state in which a display panel and a flexible circuit board are separated according to an embodiment.
Figure 6:
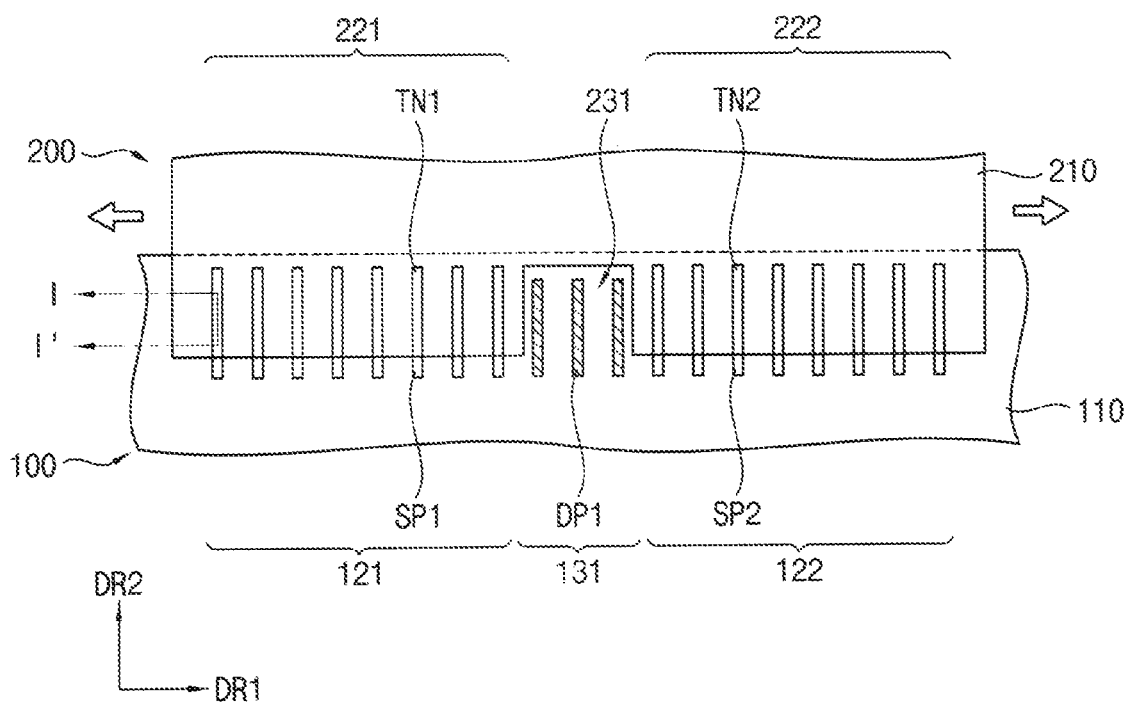
FIG. 6 is a plan view illustrating a state in which a display panel and a flexible circuit board are compressed according to an embodiment.
Figure 7:
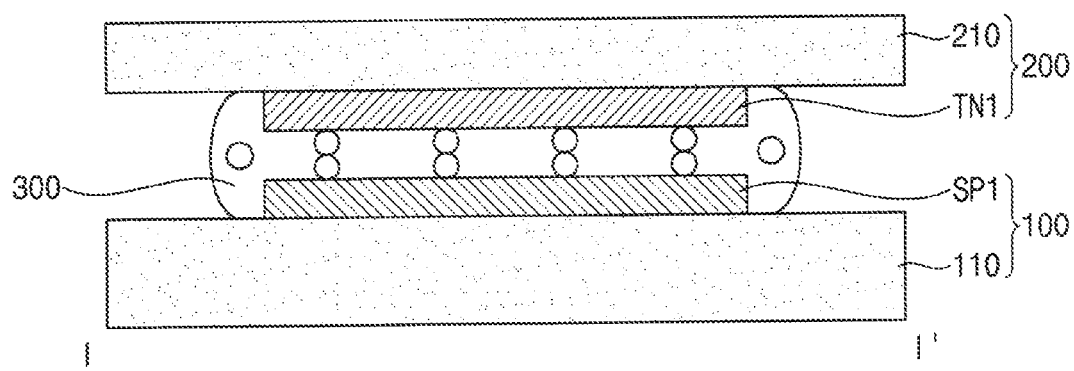
FIG. 7 is a cross-sectional view taken along a line I-I' in FIG. 6.

FIG. 5 is a plan view illustrating a state in which a display panel 100 and a flexible circuit board 200 are separated according to an embodiment. FIG. 6 is a plan view illustrating a state in which a display panel 100 and a flexible circuit board 200 are compressed according to an embodiment. FIG. 7 is a cross-sectional view taken along a line I-I' in FIG. 6.

Referring to FIGS. 5, 6, and 7, the flexible circuit board 200 may be compressed to the display panel 100 such that the first terminals TN1 and the second terminals TN2 are respectively electrically connected to the first signal pads SP1, and the second signal pads SP2 and the first cut portion 231 overlaps the first dummy pad portion 131. The first terminals TN1 and the second terminals TN2 may respectively overlap the first signal pads SP1 and the second signal pads SP2 in a plan view.

In an embodiment, the display device may further include an anisotropic conductive layer 300 disposed between the display panel 100 and the flexible circuit board 200. The anisotropic conductive layer 300 may respectively electrically connect the first terminals TN1 and the second terminals TN2 of the flexible circuit board 200 to the first signal pads SP1 and the second signal pads SP2 of the display panel 100. In an embodiment, the anisotropic conductive layer 300 may be formed on the substrate 110 to cover the first signal pads SP1 and the second signal pads SP2, and the flexible circuit board 200 may be compressed to the display panel 100 with the anisotropic conductive layer 300 interposed therebetween by applying heat and pressure such that the first terminals TN1 and the second terminals TN2 are respectively electrically connected to the first signal pads SP1 and the second signal pads SP2.

The base layer 210 of the flexible circuit board 200 may include a material that may be stretched in response to heat and/or pressure applied from the outside. In an embodiment, the base layer 210 may include polyimide (PI). When the flexible circuit board 200 is compressed to the display panel 100 by applying heat and pressure, the base layer 210 may be stretched in the first direction DR1 and/or the second direction DR2. For example, when the flexible circuit board 200 is compressed to the display panel 100, the base layer 210 may be stretched in the first direction DR1, and thus, the distance between adjacent first terminals TN1 in the first direction DR1 and the distance between adjacent second terminals TN2 in the first direction DR1 may increase. In other words, the distance between the adjacent first terminals TN1 in the first direction DR1 and the distance between the adjacent second terminals TN2 in the first direction DR1 after the flexible circuit board 200 is compressed to the display panel 100 may be greater than the distance between the adjacent first terminals TN1 in the first direction DR1 and the distance between the adjacent second terminals TN2 in the first direction DR1 before the flexible circuit board 200 is compressed to the display panel 100, respectively. Accordingly, in manufacturing the flexible circuit board 200, the distance between the adjacent first terminals TN1 in the first direction DR1 and the distance between the adjacent second terminals TN2 in the first direction DR1 may be designed in consideration of the stretch rate of the base layer 210 in response to heat and pressure.

A total stretch amount TE of the flexible circuit board 200 due to heat and pressure may be determined according to Equation 1 below.

$$TE=(n-1)A\pm\sqrt{(n-1)}a \quad \text{[Equation 1]}$$

In Equation 1, n represents the number of terminals TN1 and TN2 disposed adjacent to each other, A represents an average stretch amount for one pitch of the terminals TN1 and TN2, and a represents a stretch dispersion for one pitch of the terminals TN1 and TN2. Referring to Equation 1, as the number of terminals TN1 and TN2 disposed adjacent to each other increases, the total stretch amount TE of the flexible circuit board 200 may increase, and the stretch dispersion of the flexible circuit board 200 may increase. When the stretch dispersion of the flexible circuit board 200 increases, the degree of alignment between the terminals TN1 and TN2 of the flexible circuit board 200 and the signal pads SP1 and SP2 of the display panel 100 may decrease.

In a comparative example where a flexible circuit board does not include a cut portion, and thus, when the total number of terminals included in the flexible circuit board is N, the total stretch amount of the flexible circuit board may be $(N-1)A\pm\sqrt{(N-1)}a$. However, in an embodiment of the disclosure, the flexible circuit board 200 may include the first cut portion 231, and thus, when the number of each of the first terminals TN1 and the second terminals TN2 included in the flexible circuit board 200 is N/2, the total stretch amount of the flexible circuit board 200 may be $$\left(\frac{N}{2}-1\right)A \pm \sqrt{\left(\frac{N}{2}-1\right)}a.$$

Therefore, according to the embodiment of the disclosure, the stretch dispersion of the flexible circuit board 200 may decrease, and the degree of alignment between the terminals TN1 and TN2 of the flexible circuit board 200 and the signal pads SP1 and SP2 of the display panel 100 may be improved.

Figure 8:
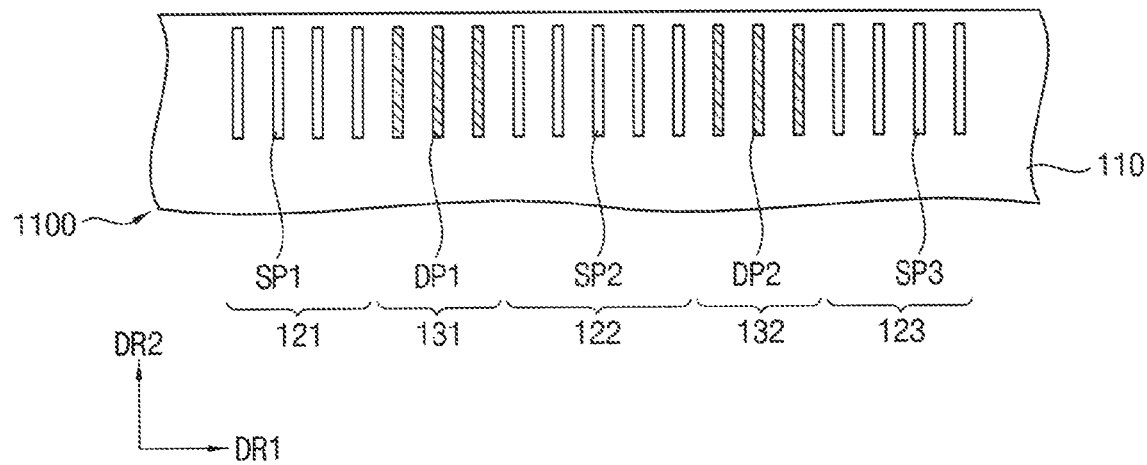
FIG. 8 is a plan view illustrating a portion of a display panel according to an embodiment.
Figure 9:
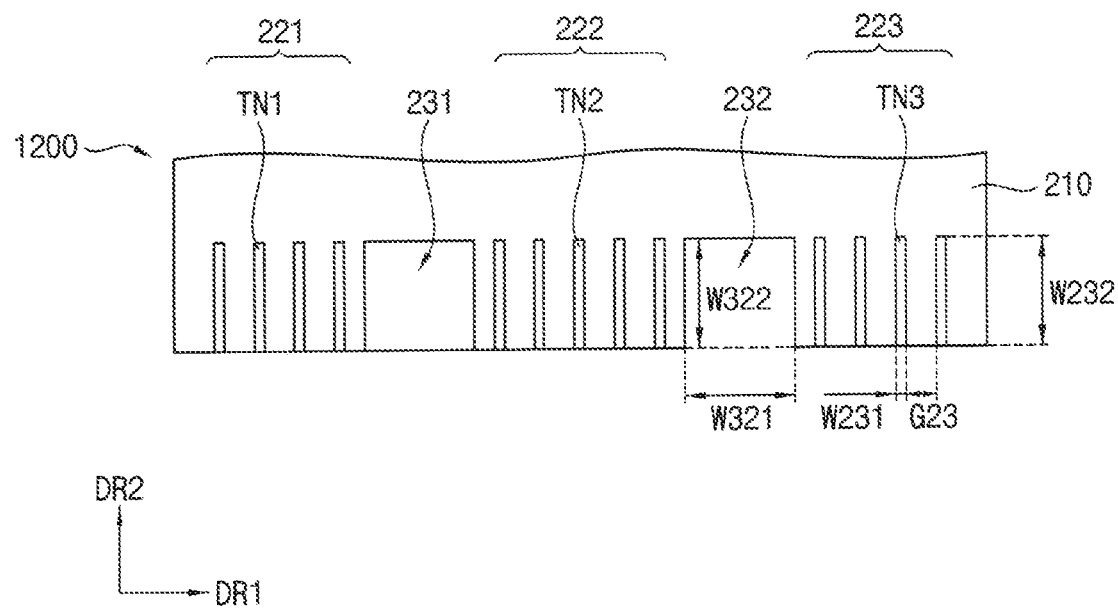
FIG. 9 is a plan view illustrating a portion of a flexible circuit board according to an embodiment.

FIG. 8 is a plan view illustrating a portion of a display panel 1100 according to an embodiment. FIG. 9 is a plan view illustrating a portion of a flexible circuit board 1200 according to an embodiment.

Referring to FIGS. 8 and 9, a display device according to an embodiment may include a display panel 1100 and a flexible circuit board 1200. Descriptions of the components of the display panel 1100 and the flexible circuit board 1200 described with reference to FIGS. 8 and 9, which are substantially the same as or similar to those of the display panel 100 and the flexible circuit board 200 described with reference to FIGS. 2 and 3, will be omitted.

The display panel 1100 may include a pad portion, and the pad portion may include multiple signal pad portions and multiple dummy pad portions disposed between the signal pad portions. In an embodiment, the pad portion may include a first signal pad portion 121, a second signal pad portion 122, a third signal pad portion 123, a first dummy pad portion 131, and a second dummy pad portion 132. The first dummy pad portion 131 may be disposed between the first signal pad portion 121 and the second signal pad portion 122, and the second dummy pad portion 132 may be disposed between the second signal pad portion 122 and the third signal pad portion 123. For example, the second dummy pad portion 132 may be disposed adjacent to the second signal pad portion 122 in the first direction DR1, and the third signal pad portion 123 may be disposed adjacent to the second dummy pad portion 132 in the first direction DR1. However, the disclosure is not limited thereto, and the pad portion may include three or more dummy pad portions disposed between the signal pad portions.

The third signal pad portion 123 may include multiple third signal pads SP3 disposed on the substrate 110. The third signal pads SP3 may be arranged along the first direction DR1, and each of the third signal pads SP3 may extend in the second direction DR2. In an embodiment, distances between adjacent third signal pads SP3 in the first direction DR1 may be uniform. In an embodiment, the distance between the adjacent third signal pads SP3 may be substantially equal to the distance between the adjacent first signal pads SP1 and the distance between the adjacent second signal pads SP2.

In an embodiment, the number of first signal pads SP1, the number of second signal pads SP2, and the number of third signal pads SP3 may be equal. In an embodiment, the number of the first signal pads SP1, the number of the second signal pads SP2, and the number of the third signal pads SP3 may be different.

The second dummy pad portion 132 may include at least one second dummy pad DP2 disposed on the substrate 110. Hereinafter, it will be described that the second dummy pad portion 132 includes multiple second dummy pads DP2. The second dummy pads DP2 may be arranged along the first direction DR1, and each of the second dummy pads DP2 may extend in the second direction DR2. In an embodiment, distances between adjacent second dummy pads DP2 in the first direction DR1 may be uniform. In an embodiment, the distance between the adjacent second dummy pads DP2 may be substantially equal to the distance between the adjacent first signal pads SP1, the distance between the adjacent second signal pads SP2, and/or the distance between the adjacent third signal pads SP3.

The flexible circuit board 1200 may include multiple terminal portions and multiple cut portions disposed between the terminal portions. In an embodiment, the flexible circuit board 1200 may include a first terminal portion 221, a second terminal portion 222, a third terminal portion 223, a first cut portion 231, and a second cut portion 232. The first cut portion 231 may be disposed between the first terminal portion 221 and the second terminal portion 222, and the second cut portion 232 may be disposed between the second terminal portion 222 and the third terminal portion 223. For example, the second cut portion 232 may be disposed adjacent to the second terminal portion 222 in the first direction DR1, and the third terminal portion 223 may be disposed adjacent to the second cut portion 232 in the first direction DR1. However, the disclosure is not limited thereto, and the flexible circuit board 1200 may include three or more cut portions disposed between the terminal portions.

The third terminal portion 223 may include multiple third terminals TN3 disposed on the base layer 210. The third terminals TN3 may be arranged along the first direction DR1, and each of the third terminals TN3 may extend in the second direction DR2. In an embodiment, distances G23 between adjacent third terminals TN3 in the first direction DR1 may be uniform. Further, widths W231 in the first direction DR1 and widths W232 in the second direction DR2 of each of the third terminals TN3 may be uniform.

In an embodiment, the distance G23 between the adjacent third terminals TN3 may be substantially equal to the distance between the adjacent first terminals TN1 and the distance between the adjacent second terminals TN2. Further, the width W231 in the first direction DR1 and the width W232 in the second direction DR2 of each of the third terminals TN3 may be substantially equal to the width in the first direction DR1 and the width in the second direction DR2 of each of the first and second terminals TN1 and TN2, respectively.

The first terminals TN1, the second terminals TN2, and the third terminals TN3 may be electrically connected to the first signal pads SP1, the second signal pads SP2, and the third signal pads SP3, respectively. In an embodiment, the first terminals TN1, the second terminals TN2, and the third terminals TN3 may be respectively one-to-one correspondence with the first signal pads SP1, second signal pads SP2, and the third signal pads SP3. In such an embodiment, the number of first terminals TN1, the number of second terminals TN2, and the number of third terminals TN3 may be equal to the number of first signal pads SP1, the number of second signal pads SP2, and the number of the third signal pads SP3, respectively.

In an embodiment, the number of first terminals TN1, the number of second terminals TN2, and the number of third terminals TN3 may be equal. In an embodiment, the number of the first terminals TN1, the number of the second terminals TN2, or the number of the third terminals TN3 may be different.

The second cut portion 232 may be an area where a portion of the flexible circuit board 1200 is cut. In an embodiment, the second cut portion 232 may have a shape in which a portion of an edge of the flexible circuit board 1200, which is adjacent to the first, second, and third terminal portions 221, 222, and 223 and positioned between the second terminal portion 222 and the third terminal portion 223, is recessed into the flexible circuit board 1200.

In an embodiment, the width W321 of the second cut portion 232 in the first direction DR1 may be substantially equal to the width of the first cut portion 231 in the first direction DR1. In an embodiment, the width W321 of the second cut portion 232 in the first direction DR1 may be different from the width of the first cut portion 231 in the first direction DR1.

In an embodiment, the width W322 of the second cut portion 232 in the second direction DR2 may be substantially equal to the width of the first cut portion 231 in the second direction DR2. In an embodiment, the width W322 of the second cut portion 232 in the second direction DR2 may be different from the width of the first cut portion 231 in the second direction DR2.

The flexible circuit board 1200 may be compressed to the display panel 1100 such that the first terminals TN1, the second terminals TN2, and the third terminals TN3 are respectively electrically connected to the first signal pads SP1, the second signal pads SP2, and the third signal pads SP3, and the first cut portion 231 and the second cut portion 232 respectively overlap the first dummy pad portion 131 and the second dummy pad portion 132. The first terminals TN1, the second terminals TN2, and the third terminals TN3 may respectively overlap the first signal pads SP1, the second signal pads SP2, and the third signal pads SP3 in a plan view.

In an embodiment, as the flexible circuit board 1200 includes multiple cut portions 231 and 232, the stretch dispersion of the flexible circuit board 1200 may further decrease, and the degree of alignment between the terminals TN1, TN2, and TN3 of the flexible circuit board 1200 and the signal pads SP1, SP2, and SP3 of the display panel 1100 may be further improved.

TABLE 1

| The number of cut portions | Total number of terminals | The number of terminals divided by cut portions | Stretch dispersion of flexible printed circuit (μm) | Reduction rate of stretch dispersion % |
|---|---|---|---|---|
| 0 | 2500 | 2500 | 7.4985 | 0 |
| 1 |  | 1250 | 5.301 | 29 |
| 2 |  | 833 | 4.258 | 42 |
| 3 |  | 625 | 3.747 | 50 |
| 4 |  | 500 | 3.351 | 55 |

Table 1 illustrates the stretch dispersion of the flexible circuit board according to the number of cut portions of the flexible circuit board. Referring to Table 1, the stretch dispersion of the flexible circuit board according to the embodiments of the disclosure in which the flexible circuit board includes at least one cut portion is relatively small compared to the comparative example where the flexible circuit board does not include the cut portion. Further, as the number of cut portions included in the flexible circuit board increases, the stretch dispersion of the flexible circuit board may decrease.

Figure 10:
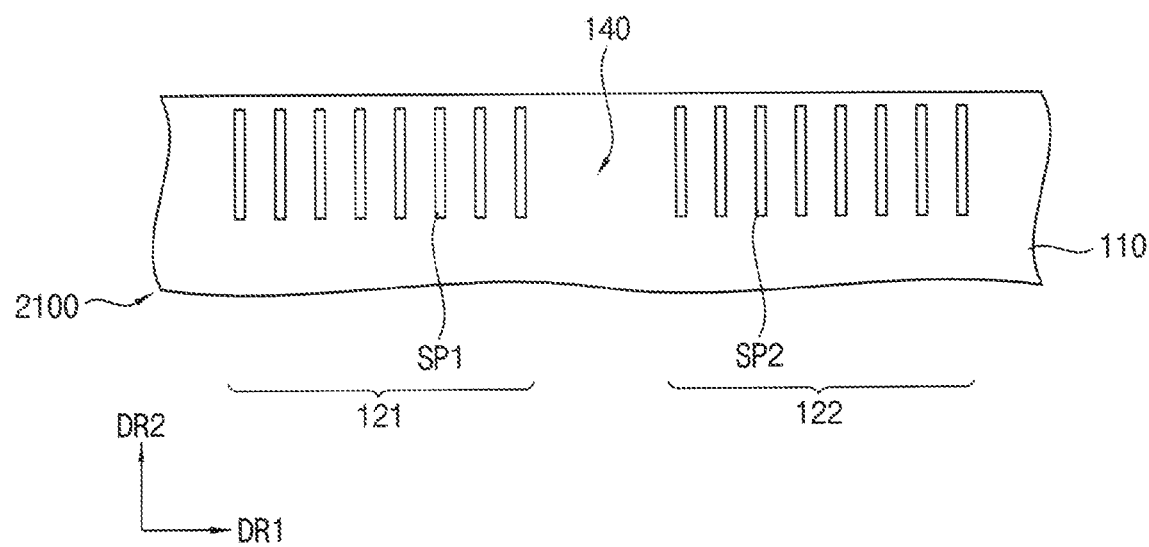
FIG. 10 is a plan view illustrating a portion of a display panel according to an embodiment.

FIG. 10 is a plan view illustrating a portion of a display panel 2100 according to an embodiment.

Referring to FIGS. 3 and 10, a display device according to an embodiment may include a display panel 2100 and a flexible circuit board 200. Descriptions of the components of the display panel 2100 and the flexible circuit board 200 described with reference to FIGS. 3 and 10, which are substantially the same as or similar to those of the display panel 100 and the flexible circuit board 200 described with reference to FIGS. 2 and 3, will be omitted.

In an embodiment, a pad portion of the display panel 2100 may include a first signal pad portion 121, a second signal pad portion 122, and a blank portion 140. The blank portion 140 may be disposed between the first signal pad portion 121 and the second signal pad portion 122. For example, the blank portion 140 may be disposed adjacent to the first signal pad portion 121 in the first direction DR1, and the second signal pad portion 122 may be disposed adjacent to the blank portion 140 in the first direction DR1.

Pads may not be disposed in the blank portion 140. In an embodiment, an alignment mark for aligning the display panel 2100 and the flexible circuit board 200 or the like may be disposed in the blank portion 140 instead of the pads.

The flexible circuit board 200 may be compressed to the display panel 2100 such that the first terminals TN1 and the second terminals TN2 are respectively electrically connected to the first signal pads SP1 and the second signal pads SP2, and the first cut portion 231 overlaps the blank portion 140. The first terminals TN1 and the second terminals TN2 may respectively overlap the first signal pads SP1 and the second signal pads SP2 in a plan view.

Figure 11:
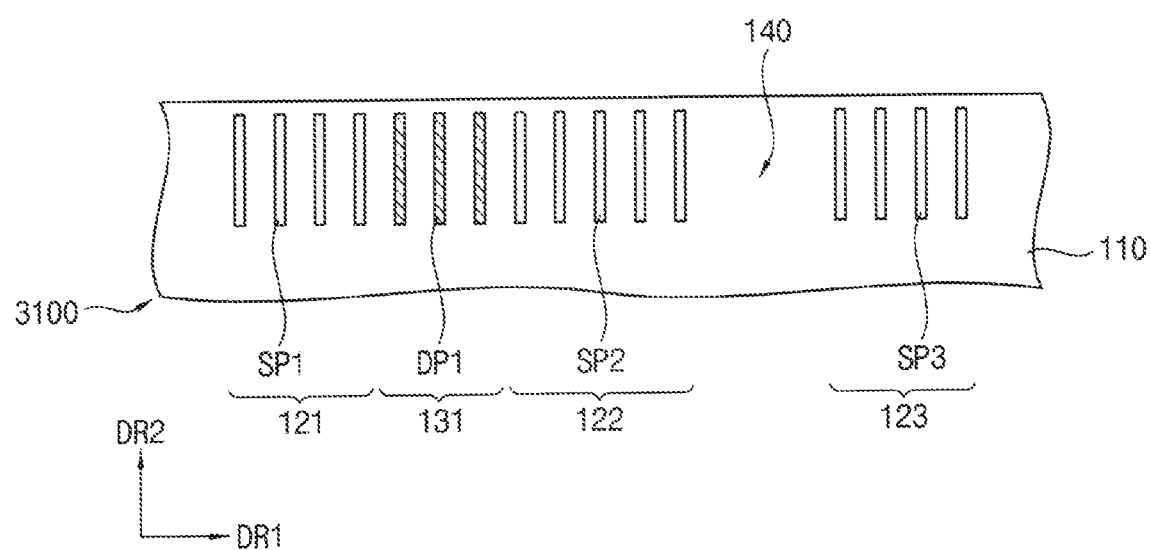
FIG. 11 is a plan view illustrating a portion of a display panel according to an embodiment.

FIG. 11 is a plan view illustrating a portion of a display panel 3100 according to an embodiment.

Referring to FIGS. 9 and 11, a display device according to an embodiment may include a display panel 3100 and a flexible circuit board 1200. Descriptions of the components of the display panel 3100 and the flexible circuit board 1200 described with reference to FIGS. 9 and 11, which are substantially the same as or similar to those of the display panel 100 and the flexible circuit board 1200 described with reference to FIGS. 8 and 9, will be omitted.

In an embodiment, a pad portion of the display panel 3100 may include a first signal pad portion 121, a second signal pad portion 122, a third signal pad portion 123, a first dummy pad portion 131, and a blank portion 140. The first dummy pad portion 131 may be disposed between the first signal pad portion 121 and the second signal pad portion 122, and the blank portion 140 may be disposed between the second signal pad portion 122 and the third signal pad portion 123. For example, the blank portion 140 may be disposed adjacent to the second signal pad portion 122 in the first direction DR1, and the third signal pad portion 123 may be disposed adjacent to the blank portion 140 in the first direction DR1.

Pads may not be disposed in the blank portion 140. In an embodiment, an alignment mark for aligning the display panel 3100 and the flexible circuit board 1200 or the like may be disposed on the blank portion 140 instead of the pads.

The flexible circuit board 1200 may be compressed to the panel 3100 such that the first terminals TN1, the second terminals TN2, and third terminals TN3 are respectively electrically connected to the first signal pads SP1, the second signal pads SP2, and the third signal pads SP3, and the first cut portion 231 and the second cut portion 232 respectively overlap the first dummy pad portion 131 and the blank portion 140. The first terminals TN1, the second terminals TN2, and the third terminals TN3 may respectively overlap the first signal pads SP1, the second signal pads SP2, and the third signal pads SP3 in a plan view.

The display device according to the embodiments of the disclosure may be applied to a display device included in a computer, a notebook, a mobile phone, a smartphone, a smart pad, a PMP, a PDA, an MP3 player, or the like.

Although the display devices according to the embodiments of the disclosure have been described with reference to the drawings, the illustrated embodiments are examples, and may be modified and changed by a person having ordinary knowledge in the relevant technical field without departing from the technical spirit of the disclosure described in the following claims.

What is claimed is:

1. A display device comprising:
a display panel including:
   a first signal pad portion including a plurality of first signal pads;
   a second signal pad portion including a plurality of second signal pads; and
   a first dummy pad portion disposed between the first signal pad portion and the second signal pad portion and including at least one first dummy pad; and
a flexible circuit board including:
   a first terminal portion including a plurality of first terminals;
   a second terminal portion including a plurality of second terminals; and
   a first cut portion of the flexible circuit board disposed between the first terminal portion and the second terminal portion, wherein
the flexible circuit board is connected to the display panel,
the plurality of first terminals are electrically connected to the plurality of first signal pads,
the plurality of second terminals are electrically connected to the plurality of second signal pads, and
the first cut portion of the flexible circuit board overlaps the first dummy pad portion of the display panel.

2. The display device of claim 1, wherein a number of the plurality of first terminals is equal to a number of the plurality of second terminals.

3. The display device of claim 1, wherein a number of the plurality of first terminals is different from a number of the plurality of second terminals.

4. The display device of claim 1, wherein
the display panel further includes:
   a third signal pad portion including a plurality of third signal pads; and
   a second dummy pad portion disposed between the second signal pad portion and the third signal pad portion and including at least one second dummy pad, and
the flexible circuit board further includes:
   a third terminal portion including a plurality of third terminals electrically connected to the plurality of third signal pads; and
   a second cut portion disposed between the second terminal portion and the third terminal portion and overlapping the second dummy pad portion.

5. The display device of claim 4, wherein a number of the plurality of first terminals, a number of the plurality of second terminals, and a number of the plurality of third terminals are equal to each other.

6. The display device of claim 4, wherein a number of the plurality of first terminals, a number of the plurality of second terminals, or a number of the plurality of third terminals are different from each other.

7. The display device of claim 4, wherein
the plurality of first terminals are arranged in a first direction, and
a width of the first cut portion in the first direction is equal to a width of the second cut portion in the first direction.

8. The display device of claim 1, wherein
the display panel further includes:
   a third signal pad portion including a plurality of third signal pads; and
   a blank portion disposed between the second signal pad portion and the third signal pad portion, and
the flexible circuit board further includes:
   a third terminal portion including a plurality of third terminals electrically connected to the plurality of third signal pads; and
   a second cut portion disposed between the second terminal portion and the third terminal portion and overlapping the blank portion.

9. The display device of claim 1, wherein
the plurality of first terminals are arranged in a first direction, and
a width of the first cut portion in the first direction is greater than a sum of a width of each of the plurality of first terminals in the first direction and a distance between adjacent first terminals of the plurality of first terminals.

10. The display device of claim 9, wherein the width of the first cut portion in the first direction is less than about 2000 μm.

11. The display device of claim 9, wherein
each of the plurality of first terminals extends in a second direction orthogonal to the first direction, and
a width of the first cut portion in the second direction is equal to a width of each of the plurality of first terminals in the second direction.

12. The display device of claim 9, wherein
each of the plurality of first terminals extends in a second direction orthogonal to the first direction, and
a width of the first cut portion in the second direction is less than a width of each of the plurality of first terminals in the second direction.

13. The display device of claim 9, wherein
each of the plurality of first terminals extends in a second direction orthogonal to the first direction, and
a width of the first cut portion in the second direction is greater than a width of each of the plurality of first terminals in the second direction.

14. The display device of claim 1, wherein a planar shape of the first cut portion is a rectangle, a semicircle, a triangle, a trapezoid, or a pentagon.

15. The display device of claim 1, wherein the flexible circuit board further includes a driving chip electrically connected to the plurality of first terminals and the plurality of second terminals.

16. The display device of claim 1, further comprising:
an anisotropic conductive layer disposed between the display panel and the flexible circuit board, the anisotropic conductive layer electrically connecting the plurality of first terminals to the plurality of first signal pads and the plurality of second terminals to the plurality of second signal pads.

17. The display device of claim 1, wherein
the flexible circuit board further includes a base layer stretching in response to an external pressure, and
the plurality of first terminals and the plurality of second terminals are disposed on the base layer.

18. A display device comprising:
a display panel including:
   a first signal pad portion including a plurality of first signal pads;
   a second signal pad portion including a plurality of second signal pads; and a blank portion of the display panel disposed between the first signal pad portion and the second signal pad portion, wherein the blank portion of the display panel does not have pads of the plurality of first signal pads or of the plurality of second signal pals disposed thereon; and a flexible circuit board including:
- a first terminal portion including a plurality of first terminals;
- a second terminal portion including a plurality of second terminals; and
- a cut portion of the flexible circuit board disposed between the first terminal portion and the second terminal portion, wherein the flexible circuit board is connected to the display panel, the plurality of first terminals are electrically connected to the plurality of first signal pads, the plurality of second terminals are electrically connected to the plurality of second signal pads, and the cut portion of the flexible circuit board overlaps the blank portion of the display panel.

19. The display device of claim 18, wherein a number of the plurality of first terminals is equal to a number of the plurality of second terminals.

20. The display device of claim 18, wherein a number of the plurality of first terminals is different from a number of the plurality of second terminals.

21. The display device of claim 17, wherein a distance between adjacent first terminals of the plurality of first terminals in a first direction and a distance between adjacent second terminals of the plurality of second terminals in the first direction increase in response to the base layer of the flexible circuit board being stretched in the first direction.

22. The display device of claim 18, wherein the blank portion of the display panel includes an alignment mark, the alignment mark configured for aligning the display panel and the flexible circuit board.

* * * * *